United States Patent [19]
Peeters et al.

[11] Patent Number: 6,036,836
[45] Date of Patent: *Mar. 14, 2000

[54] PROCESS TO CREATE METALLIC STAND-OFFS ON AN ELECTRONIC CIRCUIT

[76] Inventors: Joris Antonia Franciscus Peeters, Groenenborgerlaan 103, B-2610 Wilrijk; Louis Joseph Vandam, d'Outermontlei 5, B-2930 Brasschaat; Koenraad Juliaan Georges Allaert, Haachtsebann 136, B-3140 Keerbergen; Ann Marie Ackaert, Acacialaan 18, B-9080 Lochristi; André Michel Van Calster, Grote Reukens 14, B-9070 Heusden; Maria Eugenie André Vereeken, Vijverstraat 18, B-9030 Mariakerke; Suixin Zhang, Sint-Pietersnieuwstraat 41; Johan De Baets, Uilkensstraat 11, both of B-9000 Gent; Bart Leo Alfons Maurice Vandevelde, 't Meilrijk 94, B-3290 Diest, all of Belgium

[ * ] Notice: This patent issued on a continued prosecution application filed under 37 CFR 1.53(d), and is subject to the twenty year patent term provisions of 35 U.S.C. 154(a)(2).

[21] Appl. No.: 08/994,805

[22] Filed: Dec. 19, 1997

[30] Foreign Application Priority Data

Dec. 20, 1996 [EP] European Pat. Off. .............. 96402845

[51] Int. Cl.[7] ................................ C25D 5/02; H05K 3/00
[52] U.S. Cl. ......................... 205/125; 205/157; 205/183; 205/187; 427/96; 427/97
[58] Field of Search ..................... 205/123, 125, 205/157, 170, 181, 182, 239, 241, 242, 183, 187; 427/96, 97, 259, 282; 428/635, 636

[56] References Cited

U.S. PATENT DOCUMENTS

| | | | |
|---|---|---|---|
| 4,016,050 | 4/1977 | Lesh et al. | 204/15 |
| 4,946,563 | 8/1990 | Yeatts | 204/15 |
| 5,017,509 | 5/1991 | Tuckerman | 437/182 |
| 5,118,386 | 6/1992 | Kataoka et al. | 156/656 |
| 5,261,593 | 11/1993 | Casson et al. | 228/180.22 |
| 5,283,948 | 2/1994 | Schroeder et al. | 29/843 |
| 5,349,500 | 9/1994 | Casson et al. | 361/749 |
| 5,525,204 | 6/1996 | Shurboff et al. | 205/125 |
| 5,611,140 | 3/1997 | Kuleza et al. | 29/832 |

FOREIGN PATENT DOCUMENTS

| | | |
|---|---|---|
| 0354671 | 2/1990 | European Pat. Off. . |
| 0654818 | 5/1995 | European Pat. Off. . |
| 0675532 | 10/1995 | European Pat. Off. . |
| 9505675 | 2/1995 | WIPO . |

*Primary Examiner*—Kathryn Gorgos
*Assistant Examiner*—Wesley A. Nicolas

[57] ABSTRACT

A process to create metallic stand-offs or studs on a printed circuit board (PCB). The process allows to obtain studs constituted by three successive layers of metal (Cu1, Cu2 and Cu3 or Ni) of which at least the two first layers are made of copper. The height of the so-created stand-off is sufficient to use it in the flip chip technology to assemble chips to a printed circuit board. The present process is implemented according either to the electro-plating (galvano-plating) or to the electrochemical-plating technique.

9 Claims, 4 Drawing Sheets

PROCESS TO CREATE METALLIC STAND-OFFS ON AN ELECTRONIC CIRCUIT

BACKGROUND OF THE INVENTION

1. Technical Field

The present invention relates to a process to create at least one stand-off on an electronic circuit.

2. Discussion of Related Art

Although not exclusively reserved therefore, this process is more particularly applicable to the known "flip chip" technology wherein several high density electronic chips are assembled onto a printed circuit board by means of so-called "stand-off's". A stand-off is a metallic stud or bump which, additionally to interconnecting the chip to the board, creates a distance between them. This distance is necessary to reduce fatigue effects in the interconnection due to differences in temperature expansion coefficients of the chip, generally constituted by silicon, and the carrier, i.e. the printed circuit board. The stud may obviously not collapse, especially during the assembly process.

Processes to create stand-offs or studs on a chip are already known in the art, e.g. from an IBM™ technology called "Controlled Collapsed Chip Connection" or "C4" technology. Therein, the studs are made using evaporation techniques through molybdenum masks. This known technology involves relatively expensive silicon back-end processing and, additionally, requires high cost mask material. A method for electrically connecting flip chips to a printed circuit substrate is for instance disclosed in the U.S. Pat. No. 5,261,593 of Nov. 16, 1993, and an apparatus therefore is disclosed in the U.S. Pat. No. 5,349,500 of Sep. 20, 1994.

In the known technologies, the stand-offs are realized on the chips, i.e. by the chip providers. Since several different chips are generally mounted on a same printed circuit board, the masks for the processing of these chips need to be created for relatively low production volumes. Furthermore, at least parts of these "bumping" processes are repeated by the different chip providers. All these elements lead to increase the production cost of the flip chip technology.

SUMMARY OF INVENTION

An object of the present invention is to reduce the number of operations of the chips and thereby to dramatically reduce the production cost of a flip chip assembly.

According to the invention, this object is achieved due to the fact that said stand-off is created on the surface of a printed circuit board constituting said electronic circuit and being coated with a first layer of copper, said process including the main successive steps of plating a second layer of copper at least onto predetermined portions of said first layer of copper, and of plating a third layer of metal on top of at least portions of said second layer of copper.

In this way, the stand-offs are constituted by three layers of metal located on top of each other on the surface of the printed circuit board, i.e., in case of the flip chip technology, on the surface of the carrier rather than on the surface of the chips. The assembly cost is reduced by the use of only one single back-end processing of the printed circuit board instead of dealing separately with several chips. In other words, the cost of the "bumping" process is reduced by staying independent of the different bumping technologies associated to different chips. Moreover, the fabrication of "non-melting" stand-offs, i.e. consisting of metals that are not melting during reflow soldering, gives a good control of the stand-off height between the chip and the printed circuit board after assembly.

In more detail, said process includes the steps of:

depositing a first layer of photo-resistive material covering said first layer of copper;

creating a first pattern uncovering said first layer of copper at least at the location of the future stand-off; and plating said second layer of copper onto the uncovered portion of said first layer of copper, said second layer of copper being substantially thicker than said first layer of copper.

Stand-offs constituted by two layers of copper are thereby created on the surface of the printed circuit board. However, for some applications the height of these stand-offs is not sufficient for create the above mentioned stand-off.

To this end, the process of the present invention can further be achieved by using either an electro-plating or an electrochemical-plating technique.

On the one hand, in case of using the electro-plating, also called galvano-plating, technique, the present process is further carried out by including the steps of:

depositing a second layer of photo-resistive material;

creating a second pattern uncovering said second layer of copper at least at the location of said future stand-off; and plating said third layer of metal onto the uncovered portion of said second layer of copper.

In this way, relatively high metallic stand-offs constituted by three successive layers of copper are created.

The present electro-plating process may be completed by further including the steps of:

coating said third layer of metal with a protective layer of second metal;

stripping said first and second layers of photo-resistive material;

etching the unprotected layers of metal until the unprotected first layer of copper is removed; and stripping said protective layer of second metal.

Due to the relatively higher thickness of the second layer of copper with respect to that of the first layer of copper, the last etching step, which is a so-called differential etching step, removes the whole unprotected portions of the first layer of copper, while it only slightly affects the thickness of the unprotected portions of the second layer of copper.

It is further to be noted that the metal of said third layer is preferably copper.

Finally, the present process may be completed by further including the step of electrochemical plating a layer of nickel onto the unprotected layers of copper, and the step of flash plating a layer of gold onto said layer of nickel.

On the other hand, in case of using the electrochemical-plating technique, the above process of the present invention is further carried out by including the steps of:

coating said second layer of copper with a protective layer of second metal;

stripping said first layer of photo-resistive material;

etching the unprotected first layer of copper;

stripping said protective layer of second metal, depositing a layer of photo sensitive dielectric material;

creating a second pattern removing said layer of photo sensitive dielectric material at the location of said future metallic stand-off; and plating a third layer of metal onto the uncovered portions of said second layer of copper.

In this way, a relatively high metallic stand-off constituted by three successive layers of metal is created.

In a first embodiment of the present electrochemical-plating process, the metal of said third layer is copper.

The process then further includes the steps of electrochemical plating a layer of nickel onto said stand-off using said layer of photo sensitive dielectric material as mask.

In a second embodiment of the present electrochemical-plating process, the metal of said third layer is nickel.

The electrochemical-plating process is then completed by further including the step of flash plating a layer of gold onto said layer of nickel using said layer of photo sensitive dielectric material as mask.

A good electric contact terminal or pad is thereby realized.

In the above processes, the second metal of said protective layer is preferably tin-lead.

The present technology can be applied to very large area substrates, i.e. different dimensions of printed circuit boards, combining several different flip chip Input/Output (I/O) locations in one design and manufacturing process. It further can accommodate the assembly of most standard available chips.

BRIEF DESCRIPTION OF THE DRAWING

The above mentioned and other objects and features of the invention will become more apparent and the invention itself will be best understood by referring to the following description of an embodiment taken in conjunction with the accompanying drawings wherein.

DETAILED DESCRIPTION OF PREFERRED EMBODIMENTS

Figure 1:
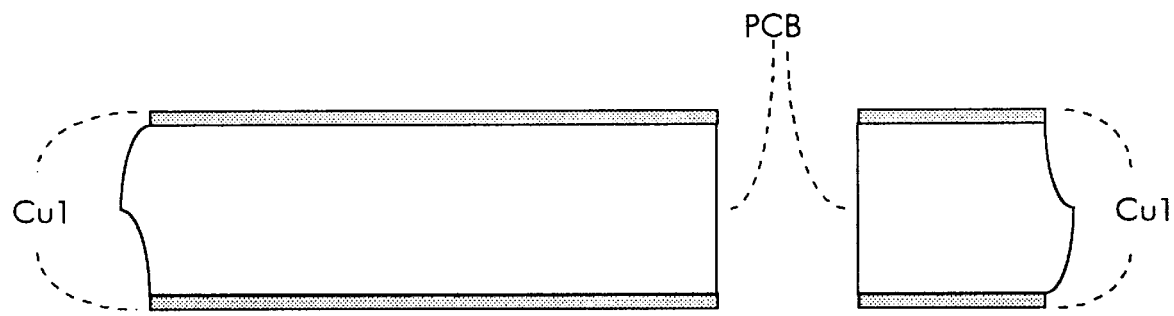
FIGS. 1 to 3 show common steps for the electro-plating and the electrochemical-plating process according to the invention.

The process show in the drawings FIGS. 1 to 10 is used to create metallic bumps or stand-offs on the surface of a printed circuit board in order to realize a flip chip assembly.

The drawings show a portion of a transversal section of a printed circuit board PCB provided with a hole. The board PCB is coated on its upper and lower surface with a basis layer of copper Cu1 as shown in FIG. 1. The processing steps described below lead to obtain, on the board PCB, an optimal combination of conductive copper paths, elevated stand-offs and plated-through holes, the stand-offs being used to allow external Input/Output (I/O) connections to flip chips and are also called "studs".

In the following part of the description, two possible techniques used to create a metallic stand-off and a plated-through hole will be explained. The successive processing steps according to a first technique, called electro- or galvano-plating technique, are represented in the FIG. 1 to 6, while the successive processing steps according to a second technique, called electrochemical-plating technique, are represented in the FIG's 1 to 3 and 7 to 10. The FIG's 1 to 3 are thus common for these two techniques and will be explained only once below.

Figure 2:
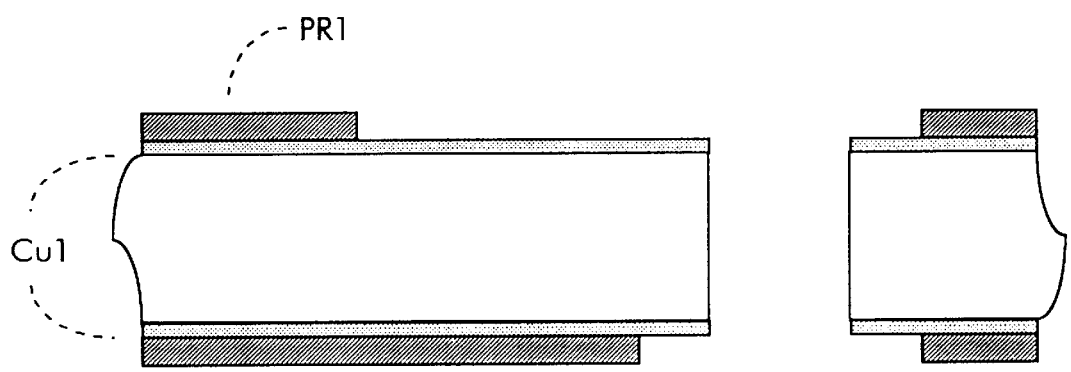

The first step of the present process consists in depositing a first layer of photo-resistive material PR1 covering the basis layer of copper Cu1 on both sides of the PCB. A pattern is then created in the photo-resistive material PR1 according to a technique well known in the art and therefore not explained in more detail hereafter. FIG. 2 shows the board after the creation of the pattern on the layer PR1.

Figure 3:
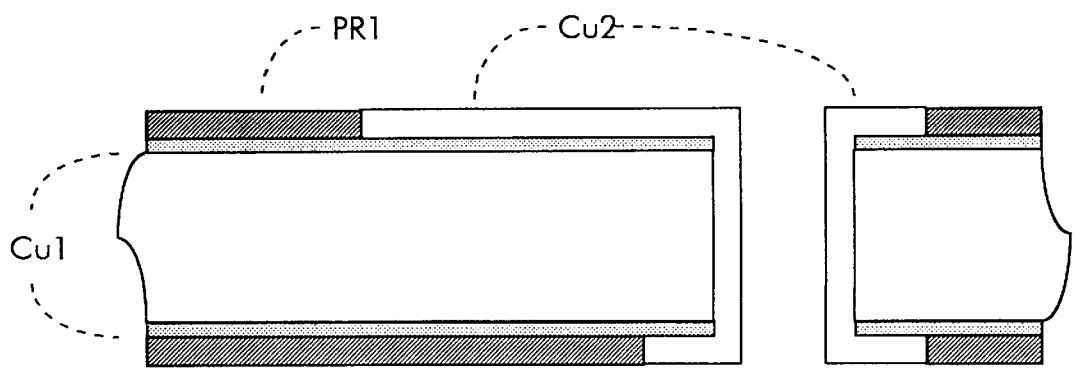

A further step of the process consists in plating a second layer of copper Cu2 onto the uncovered portions of the basis or first layer of copper Cu1, i.e. by using the patterned layer PR1 as mask. The second layer of copper Cu2 has a thickness which is substantially larger than that of the first layer of copper Cu1. This second layer of copper Cu2 is not only deposited onto the uncovered portions of Cu1 but also in the hole drilled through the printed circuit board PCB as shown in FIG. 3.

The above mentioned two techniques differentiate now. The following explanations relate to the electro-plating or galvano-plating technique, and the electrochemical-plating technique will be explained later starting from this step.

Figure 4:
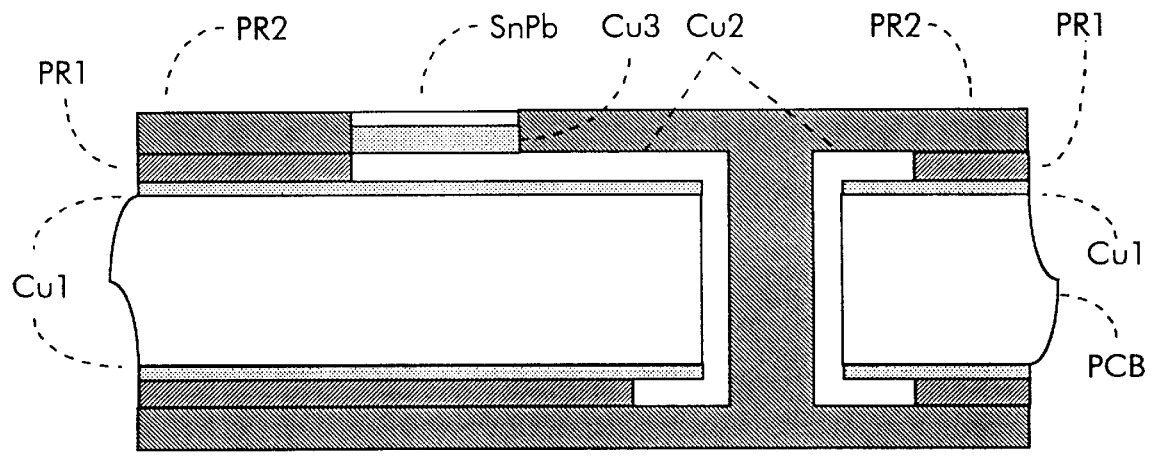
FIGS. 4 to 6 show further steps of the electro-plating process.

In the electro-plating technique, the next step consists in depositing a second layer of photo-resistive material PR2 on the device. A pattern is then create on the second photo-resistive layer PR2 leaving uncovered the portions of copper Cu2 at the location of the future stand-off. A further step of this process consists in plating a third layer of copper Cu3 on these uncovered portions of Cu2. Still by using the second patterned layer PR2 as mask, a protective metallic layer of tin-lead SnPb is deposited on top of the layer Cu3. The result is shown in FIG. 4.

Figure 5:
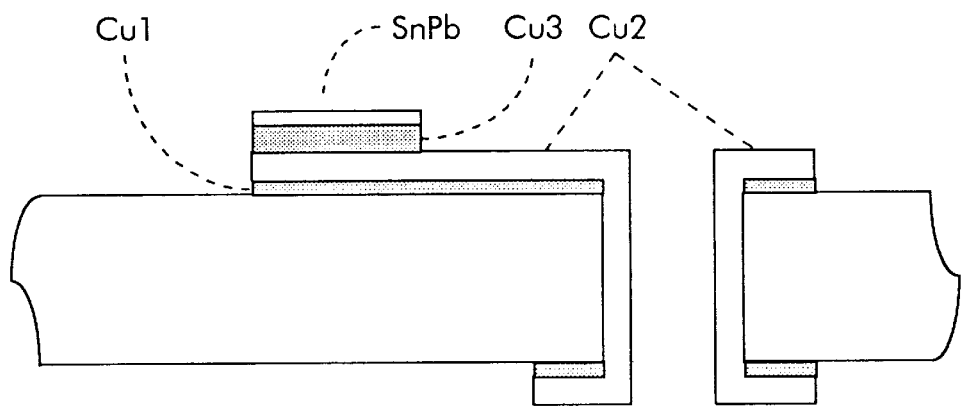

The two layers PR1 and PR2 of photo-resistive material are then stripped away. Afterwards, the unprotected portions of the layers of copper Cu1 and Cu3 are etched until the uncovered portions of the layer Cu1 are removed from the board PCB as shown in FIG. 5.

After this differential etching of the copper layers Cu1 and Cu2 using the tin-lead layer SnPb as mask, the remaining overall thickness of the two layers of copper Cu1 and Cu2 is of about 35 $\mu$m.

Figure 6:
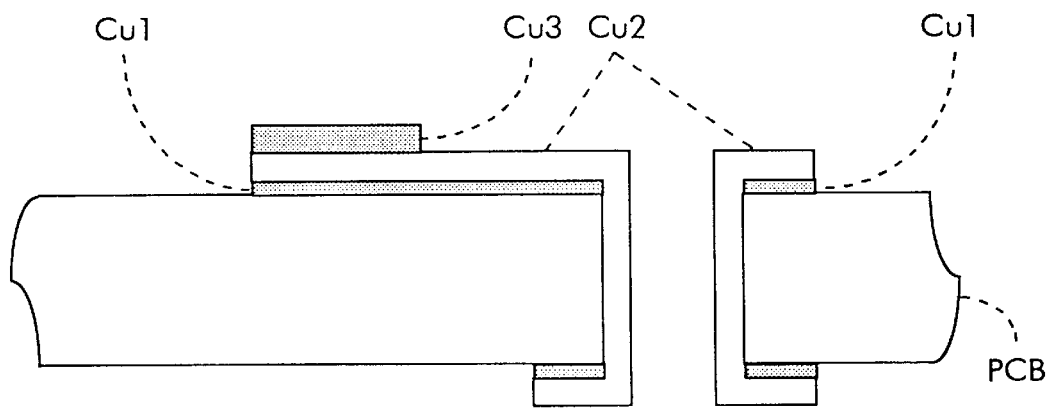

Finally the protective metallic layer of tin-lead SnPb is stripped away and a high stand-off comprising the three successive layers of copper Cu1, Cu2 and Cu3 is created as shown in FIG. 6. The height of the metallic stand-off is between 50 and 75 $\mu$m.

The still unprotected layers of copper Cu2 and Cu3 may then be coated by a relatively thin protective layer of nickel electrochemically plated thereon. A good electric contact may further be achieved by flash plating a layer of gold on top of the protective layer of nickel. The result of these last plating steps are not shown in the figures.

This completes the electro-plating technique.

Figure 7:
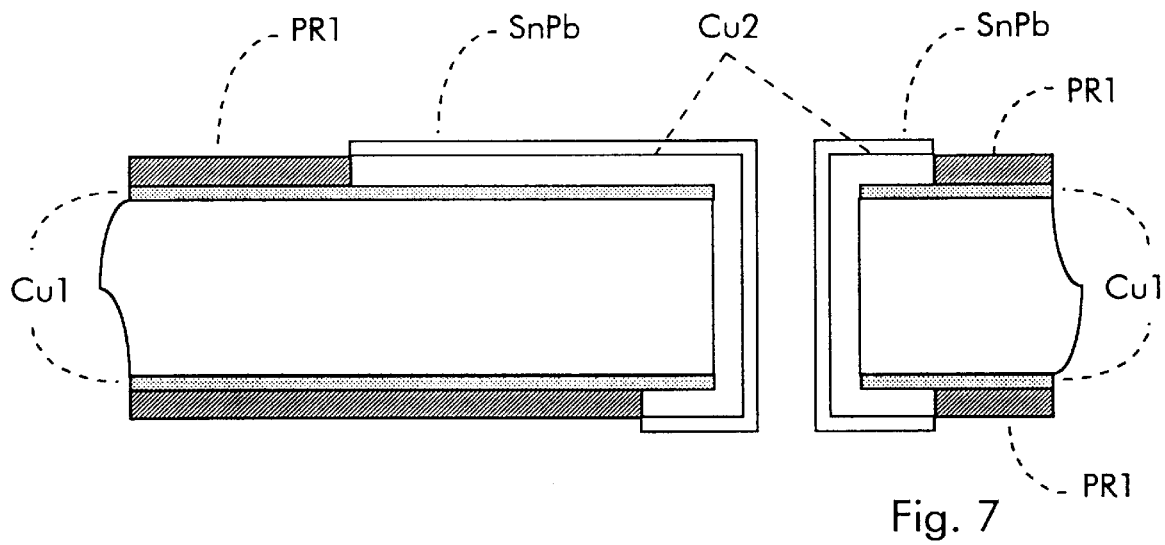
FIGS. 7 to 10 show further steps of the electrochemical-plating process.

In the electrochemical-plating technique, the step following the one shown in FIG. 3 is represented in FIG. 7 and consists in depositing a protective metallic layer of tin-lead SnPb on top of the layer Cu2, using the patterned photo-resistive layer PR1 as mask. The protective layer SnPb is deposited in a galvanic way as known in the art.

Figure 8:
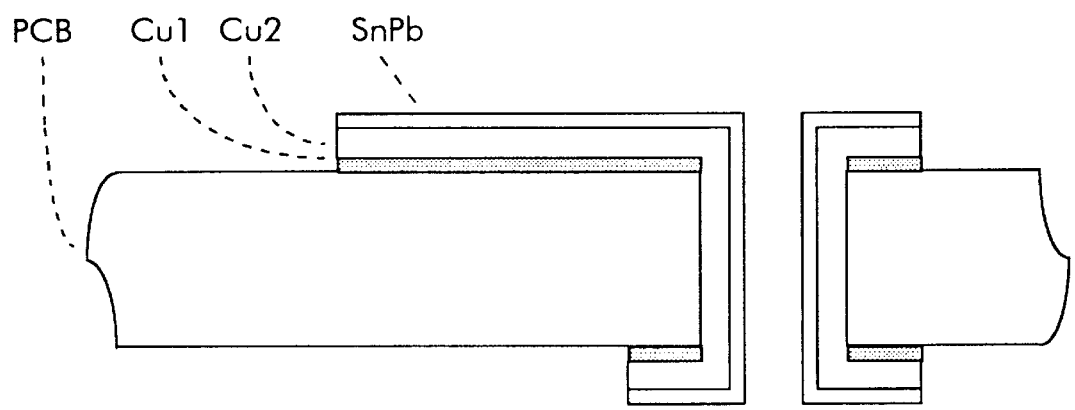

The photo-resistive layer PR1 is then stripped away and the remaining uncovered portions of the basis layer of copper Cu1 are etched using the layer SnPb as a mask. The result is shown in FIG. 8.

Figure 9:
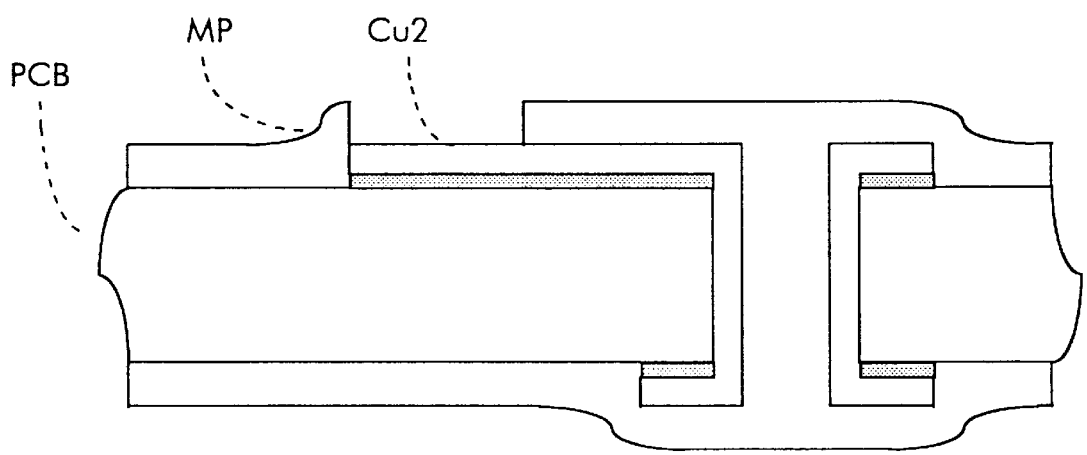
Figure 10:
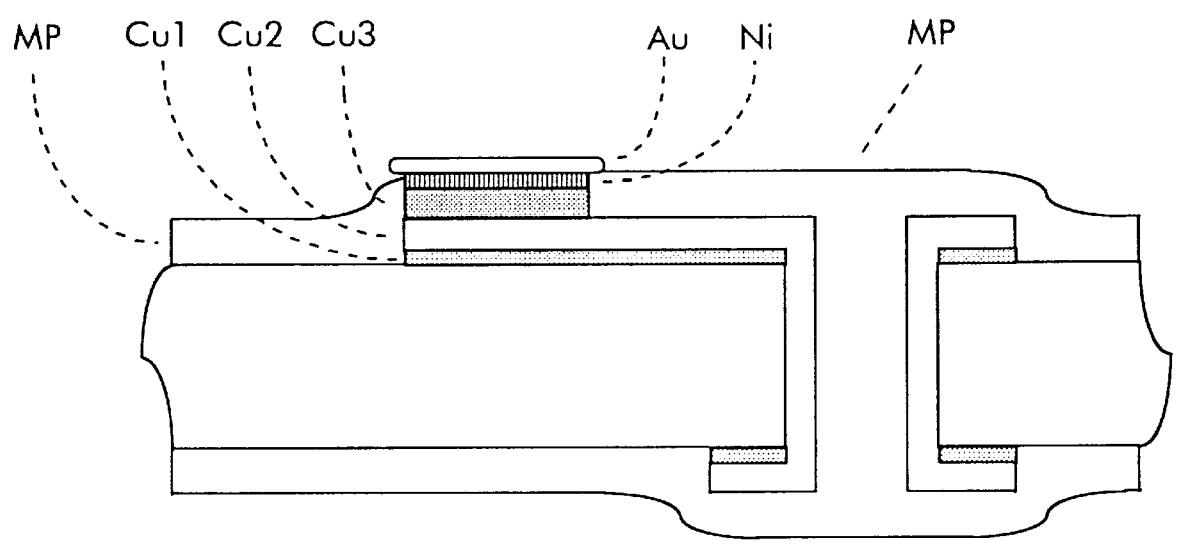

The following step consists in stripping the protective metallic layer SnPb. A layer of photo sensitive dielectric material MP is then deposited over the whole device as shown in FIG. 9. Such a deposition may for instance be realized by means of the known "curtain coating" technique and the dielectric layer MP is for instance constituted by the dielectric coating material MULTIPOSIT™ of the company "Shipley". The reason for depositing a layer of photo sensitive dielectric material MP rather than a photo-resistive layer is that the latter does not resist to a nickel-gold deposition as will be performed later.

A pattern is then created in the dielectric layer MP as shown in FIG. 9. This pattern defines the position of the stand-off in a photo-lithographic way by removing the layer of photo sensitive dielectric material MP at the location of this future stand-off.

According to a first variant of realization, a third layer of copper Cu3 is plated onto the then uncovered portions of the second layer of copper Cu2. A high stand-off comprising the three successive layers of copper Cu1, Cu2 and Cu3 is so created.

As for the above described galvano-plating technique, the third layer of copper Cu3 may then be coated by a relatively thin protective layer of nickel Ni electrochemically plated thereon. This plating process uses the dielectric layer MP as a mask. The process is completed with a flash deposition or plating of gold Au over the nickel layer Ni. Here again the dielectric layer MP is used as a mask. The thickness of the gold layer Au is of about 0.1 $\mu$m and is used to improve the electric contact with the chip to be connected to the stand-off.

According to another variant of realization, not shown in the figures, a relatively thick layer of nickel is plated onto the uncovered portions of the second layer of copper Cu2. The so-created stand-off is then constituted by two layers of copper Cu1 and Cu2 and a thick layer of nickel. Here again the layer of nickel may be covered by a layer of gold to provide a good electric contact. It is to be noted that the layers of nickel and gold are deposited by using the dielectric layer MP as a mask and that the gold layer is preferably deposited according to the flash plating technique.

While the principles of the invention have been described above in connection with specific apparatus, it is to be clearly understood that this description is made only by way of example and not as a limitation on the scope of the invention.

We claim:

1. Process to create at least one stand-off on an electronic circuit, characterized in that said stand-off is created on the surface of a printed circuit board constituting said electronic circuit and being coated with a first layer of copper, said process including the sequential steps of:

depositing a first layer of photo-resistive material covering said first layer of copper;

creating a first pattern uncovering said first layer of copper at least at the location of the future stand-off;

plating a second layer of copper onto the uncovered portion of said first layer of copper, said second layer of copper being substantially thicker than said first layer of copper, said second layer of copper forming a second pattern;

depositing a second layer of photo-resistive material;

creating a third pattern uncovering said second layer of copper at least at the location of said future stand-off; and plating a third layer of copper onto the uncovered portion of said second layer of copper after the step of creating the third pattern, wherein said third layer of copper forms a fourth pattern different from the second pattern and wherein said second layer of copper physically separates said entire third layer of copper from said first layer of copper.

2. Process according to claim 1, characterized in that, after the step of plating the third layer of copper, said process further includes the sequential steps of:

coating said third layer of copper with a protective layer of metal to protect the third layer of copper against etching;

stripping said first and second layers of photo-resistive material;

etching the unprotected layers of metal until the unprotected first layer of copper is removed; and stripping said protective layer of second metal.

3. Process according to claim 2, characterized in that it further includes the step of electrochemical plating a layer of nickel onto the unprotected layers of copper.

4. Process according to claim 3, characterized in that it further includes the step of flash plating a layer of gold onto said layer of nickel.

5. Process according to claim 1, characterized in that said second layer of copper is also used as a protective layer for said first layer of copper and said process further includes the sequential steps of:

coating said third layer of copper with a protective layer of second metal against etching;

stripping said first and second layers of photoresist material;

etching the unprotected layers of metal until the unprotected first layer of copper is removed, and stripping said protective layer of second metal.

6. Process to create at least one stand-off on an electronic circuit, characterized in that said stand-off is created on the surface of a printed circuit board constituting said electronic circuit and being coated with a first layer of copper, said process including the sequential steps of:

depositing a first layer of photo-resistive material covering said first layer of copper;

creating a first pattern uncovering said first layer of copper at least at the location of the future stand-off;

plating a second layer of copper onto the uncovered portion of said first layer of copper, said second layer of copper being substantially thicker than said first layer of copper, said second layer of copper forming a second pattern;

coating said second layer of copper with a protective layer of second metal against etching;

stripping said first layer of photo-resistive material;

etching the unprotected first layer of copper;

stripping said protective layer of second metal;

depositing a layer of photo sensitive dielectric material;

creating a third pattern by removing said layer of photo sensitive dielectric material at the location of said future metallic stand-off; and plating a third layer of copper, onto the uncovered portion of said second layer of copper after the step of creating the third pattern, wherein said third layer of copper forms a fourth pattern different from the second pattern.

7. Process according to claim 6, characterized in that it further includes the step of electrochemical plating a layer of nickel onto said stand-off using said layer of photo sensitive dielectric material as mark.

8. Process according to claim 7, characterized in that it further includes the step of flash plating a layer of gold (Au) onto said layer of nickel (Ni) using said layer of photo sensitive dielectric material (MP) as a mask.

9. Process according to claim 6, characterized in that the second metal of said protective layer is tin-lead, wherein the second metal of said protective layer forms a fifth pattern different from the fourth pattern.

\* \* \* \* \*